(12) United States Patent
Ok et al.

(10) Patent No.: US 11,574,843 B2
(45) Date of Patent: Feb. 7, 2023

(54) THIN FILM TRANSISTOR AND DISPLAY APPARATUS COMPRISING THE SAME

(71) Applicant: LG Display Co., Ltd., Seoul (KR)

(72) Inventors: KyungChul Ok, Paju-si (KR); JungSeok Seo, Paju-si (KR); PilSang Yun, Paju-si (KR); Jiyong Noh, Paju-si (KR); Jaeman Jang, Paju-si (KR); InTak Cho, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 163 days.

(21) Appl. No.: 17/124,344

(22) Filed: Dec. 16, 2020

(65) Prior Publication Data
US 2021/0202755 A1 Jul. 1, 2021

(30) Foreign Application Priority Data
Dec. 31, 2019 (KR) .................. 10-2019-0179534

(51) Int. Cl.
*H01L 21/8234* (2006.01)
*H01L 27/32* (2006.01)
(Continued)

(52) U.S. Cl.
CPC .............. *H01L 21/823462* (2013.01); *H01L 21/02483* (2013.01); *H01L 21/02488* (2013.01);
(Continued)

(58) Field of Classification Search
CPC ......... H01L 21/02483; H01L 21/02488; H01L 21/02502; H01L 21/02554; H01L 21/02565; H01L 21/0262; H01L 21/823412; H01L 21/823462; H01L 21/04288; H01L 27/1225; H01L 27/3262;
(Continued)

(56) References Cited

U.S. PATENT DOCUMENTS 7,068,418 B2   6/2006 Kawase
7,468,580 B2   12/2008 Kawase
(Continued)

FOREIGN PATENT DOCUMENTS

KR  10-2010-0105073 A   9/2010
TW         569443 B   1/2004
(Continued)

OTHER PUBLICATIONS

Taiwan Intellectual Property Administration, Office Action, TW Patent Application No. 109146890, dated Feb. 21, 2022, 17 pages.
(Continued)

*Primary Examiner* — Cheung Lee
(74) *Attorney, Agent, or Firm* — Fenwick & West LLP

(57) ABSTRACT

Disclosed is a thin film transistor, a method for manufacturing the same and a display apparatus comprising the same, wherein the thin film transistor includes a first insulating layer on a substrate, an active layer on the first insulating layer, and a gate electrode spaced apart from the active layer and configured to have at least a portion overlapped with the active layer, wherein the active layer has a single crystal structure of an oxide semiconductor material, and an upper surface of the first insulating layer which contacts the active layer is an oxygen (O) layer made of oxygen (O).

20 Claims, 12 Drawing Sheets

(51) Int. Cl.
*H01L 29/66* (2006.01)
*H01L 29/786* (2006.01)
*H01L 21/02* (2006.01)
*H01L 27/12* (2006.01)

(52) U.S. Cl.
CPC .................. *H01L 21/02565* (2013.01); *H01L 21/823412* (2013.01); *H01L 27/1225* (2013.01); *H01L 27/3262* (2013.01); *H01L 29/66742* (2013.01); *H01L 29/7869* (2013.01); *H01L 29/78693* (2013.01); *H01L 29/78696* (2013.01)

(58) Field of Classification Search
CPC ........... H01L 29/66742; H01L 29/7869; H01L 29/78693; H01L 29/78696; G02F 1/1368
See application file for complete search history.

(56) References Cited

U.S. PATENT DOCUMENTS

| | | | |
|---|---|---|---|
| 8,139,005 | B2 | 3/2012 | Kawase |
| 8,344,378 | B2 | 1/2013 | Nakajima et al. |
| 8,956,934 | B2 | 2/2015 | Nakajima et al. |
| 9,028,623 | B2 | 5/2015 | Delabie et al. |
| 9,171,942 | B2 | 10/2015 | Mochizuki et al. |
| 10,032,953 | B2 | 7/2018 | Jeon et al. |
| 10,446,711 | B2 | 10/2019 | Jeon et al. |
| 2003/0141807 | A1 | 7/2003 | Kawase |
| 2005/0218791 | A1 | 10/2005 | Kawase |
| 2008/0246704 | A1 | 10/2008 | Kawase |
| 2010/0327281 | A1 | 12/2010 | Nakajima et al. |
| 2012/0112180 | A1 | 5/2012 | Zan |
| 2013/0095617 | A1 | 4/2013 | Nakajima et al. |
| 2013/0193432 | A1* | 8/2013 | Yamazaki ............... H01L 29/24 257/43 |
| 2013/0299818 | A1 | 11/2013 | Tanaka |
| 2014/0008647 | A1* | 1/2014 | Yamazaki ............... H01L 29/24 257/43 |
| 2014/0084286 | A1 | 3/2014 | Jeon et al. |
| 2014/0134795 | A1 | 5/2014 | Mochizuki et al. |
| 2018/0315885 | A1 | 11/2018 | Jeon et al. |

FOREIGN PATENT DOCUMENTS

| | | |
|---|---|---|
| TW | 201220504 A | 5/2012 |
| TW | 201222821 A | 6/2012 |
| TW | 201413975 A | 4/2014 |
| TW | I525831 B | 3/2016 |
| WO | WO 2013/018447 A1 | 2/2013 |

OTHER PUBLICATIONS

European Patent Office, Extended European Search Report and Opinion, EP Patent Application No. 20217301.9, dated May 21, 2021, 12 pages.

Biethan, J-P. et al., "Backside Gate Thin Film Transistor based on MOCVD Grown ZnO on $SiO_2$/Si Substrates," IEEE, Jun. 21, 2010, pp. 237-238.

Sbrockey, N.M. et al., "ZnO thin films by MOCVD," III-Vs Review, vol. 17, No. 7, Sep. 2004, pp. 23-25.

Nomura, K. et al., "Thin-Film Transistor Fabricated in Single-Crystalline Transparent Oxide Semiconductor," Science, vol. 300, May 23, 2003, pp. 1269-1272.

Taiwan Intellectual Property Administration, Office Action, TW Patent Application No. 109146890, dated Nov. 2, 2021, 14 pages.

Taiwan Intellectual Property Office, Office Action, TW Patent Application No. 109146890, dated Aug. 31, 2022, 20 pages.

\* cited by examiner

THIN FILM TRANSISTOR AND DISPLAY APPARATUS COMPRISING THE SAME

CROSS-REFERENCE TO RELATED APPLICATIONS

This application claims the benefit of Republic of Korea Patent Application No. 10-2019-0179534 filed on Dec. 31, 2019, which is hereby incorporated by reference as if fully set forth herein.

BACKGROUND

Field

The present disclosure relates to a thin film transistor and a display apparatus. In more detail, the present disclosure relates to a thin film transistor comprising an active layer having a single crystal structure of an oxide semiconductor material, and a display apparatus comprising the thin film transistor.

Discussion of the Related Art

A thin film transistor may be manufactured on a glass substrate or a plastic substrate, whereby the thin film transistor is widely used as a switching device or a driving device in a display apparatus such as a liquid crystal display device or an organic light emitting device.

According to a material used for an active layer, the thin film transistor may be largely categorized into an amorphous silicon thin film transistor having an active layer of amorphous silicon, a polycrystalline silicon thin film transistor having an active layer of polycrystalline silicon, and an oxide semiconductor thin film transistor having an active layer of oxide semiconductor.

In case of the oxide semiconductor thin film transistor (oxide semiconductor TFT) having a large resistance change in accordance with an oxygen content, it is advantageous in that it facilitates to obtain the desired properties. Also, an oxide for an active layer may be formed in a film type at a relatively low temperature for a process of manufacturing the oxide semiconductor thin film transistor, whereby a manufacturing cost is lowered. Also, the oxide semiconductor layer is transparent owing to the properties of oxide, whereby it is favorable to realization of a transparent display apparatus. However, the oxide semiconductor thin film transistor has a disadvantage of a low field effect mobility.

In order to improve the field effect mobility of the oxide semiconductor thin film transistor, there is a method for making a single crystal structure in the oxide semiconductor.

However, a process of making the single-crystalline oxide semiconductor in a large sized area is not easy. For example, in order to make the single-crystalline oxide semiconductor in a large sized area, it is necessary to apply a heat treatment of a high temperature above 500° C. to the oxide semiconductor, or to make an epitaxial growth of the oxide semiconductor. Accordingly, the process of making the single-crystalline oxide semiconductor is difficult.

SUMMARY

The present disclosure has been made in view of the above problems, and it is an object of the present disclosure to provide a thin film transistor comprising an oxide semiconductor layer having a single crystal structure.

It is another object of the present disclosure to provide a thin film transistor comprising an active layer formed of an oxide semiconductor layer of a single crystal structure, and having a good field effect mobility.

It is a further another object of the present disclosure to provide a method for forming an oxide semiconductor layer having a single crystal structure by controlling a structure of an insulating layer positioned below the oxide semiconductor layer.

It is a further another object of the present disclosure to provide a display apparatus comprising an oxide semiconductor thin film transistor having a good field effect mobility.

In accordance with an aspect of the present disclosure, the above and other objects can be accomplished by the provision of a thin film transistor comprising a first insulating layer on a substrate, an active layer on the first insulating layer, and a gate electrode spaced apart from the active layer and configured to have at least a portion overlapped with the active layer, wherein the active layer has a single crystal structure of an oxide semiconductor material, and an upper surface of the first insulating layer which contacts the active layer is an oxygen (O) layer made of oxygen (O).

The metal element of a lower surface of the active layer may be combined with the oxygen (O) of the oxygen layer of the first insulating layer.

The first insulating layer may include an Epi-oxide layer, wherein the Epi-oxide layer contacts the active layer.

The epi-oxide layer may include at least one among silicon oxide (SiOx), hafnium oxide (HfOx), aluminum oxide (AlOx), zirconium oxide (ZrOx), hafnium silicate (Hf-SiOx), and zirconium silicate (Zr-SiOx).

The first insulating layer includes at least one of a CVD layer and an ALD layer disposed between the substrate and the Epi-oxide layer.

The active layer includes at least one among oxide semiconductor materials, for example, ZO(ZnO)-based oxide semiconductor, IZO(InZnO)-based oxide semiconductor, IGZO(InGaZnO)-based oxide semiconductor, TO(SnO)-based oxide semiconductor, IGO(InGaO)-based oxide semiconductor, ITO(InSnO)-based oxide semiconductor, IGZTO(InGaZnSnO)-based oxide semiconductor, GZTO(GaZnSnO)-based oxide semiconductor, GZO (GaZnO)-based oxide semiconductor, GO(GaO)-based oxide semiconductor, IO(InO)-based oxide semiconductor, and ITZO(InSnZnO)-based oxide semiconductor.

The active layer may include a first oxide semiconductor layer, and a second oxide semiconductor layer on the first oxide semiconductor layer.

The thin film transistor may further include a second insulating layer on the active layer.

The second insulating layer may be manufactured by an atomic layer deposition (ALD) method or a metal organic chemical vapor deposition (MOCVD) method.

The first insulating layer may be disposed between the substrate and the active layer.

The active layer may be disposed between the first insulating layer and the gate electrode.

The gate electrode may be disposed between the substrate and the first insulating layer.

In accordance with another aspect of the present disclosure, there is provided a display apparatus comprising the thin film transistor.

In accordance with a further aspect of the present disclosure, there is provided a method for manufacturing a thin film transistor comprising providing a first insulating layer on a substrate, providing an active layer on the first insulating layer, and providing a gate electrode spaced apart from the active layer and configured to have at least a portion overlapped with the active layer, wherein the providing the first insulating layer includes treating an upper surface of the first insulating layer with oxygen, and the active layer is formed of an oxide semiconductor material.

The upper surface of the first insulating layer may be an oxygen layer.

The step of providing the first insulating layer may include providing an Epi-oxide layer.

The Epi-oxide layer may be manufactured by an atomic layer deposition (ALD) method or a metal organic chemical vapor deposition (MOCVD) method.

The active layer may be manufactured by an ALD method or a MOCVD method.

The method includes at least one of providing a CVD layer and providing an ALD layer by an ALD method before the providing of the Epi-oxide layer.

BRIEF DESCRIPTION OF THE DRAWINGS

The above and other objects, features and other advantages of the present disclosure will be more clearly understood from the following detailed description taken in conjunction with the accompanying drawings.

DETAILED DESCRIPTION

Figure 1:
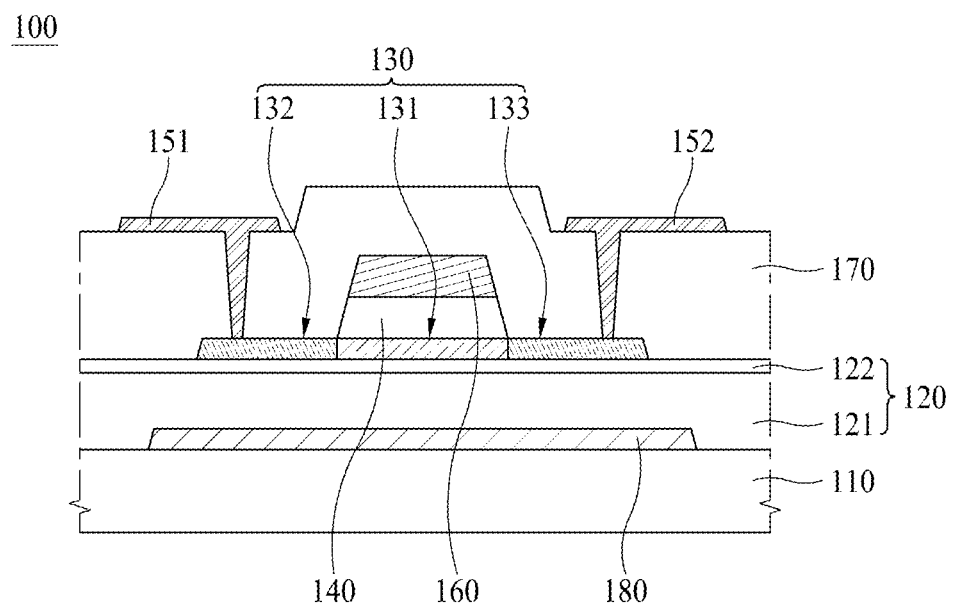
FIG. 1 is a cross sectional view illustrating a thin film transistor according to one embodiment of the present disclosure.

Advantages and features of the present disclosure, and implementation methods thereof will be clarified through the following embodiments, described with reference to the accompanying drawings. The present disclosure may, however, be embodied in different forms and should not be construed as being limited to the embodiments set forth herein. Rather, these embodiments are provided so that this disclosure will be thorough and complete, and will fully convey the scope of the present disclosure to those skilled in the art. Further, the present disclosure is only defined by the scope of the claims.

The shapes, sizes, ratios, angles, and numbers disclosed in the drawings for describing embodiments of the present disclosure are merely examples, and thus the present disclosure is not limited to the illustrated details. Like reference numerals refer to like elements throughout. In the following description, when the detailed description of the relevant known function or configuration is determined to unnecessarily obscure the important point of the present disclosure, the detailed description will be omitted.

In the case in which "comprise," "have," and "include" described in the present specification are used, another part may also be present unless "only" is used. The terms in a singular form may include plural forms unless noted to the contrary.

In construing an element, the element is construed as including an error region although there is no explicit description thereof.

In describing a positional relationship, for example, when the positional order is described as "on," "above," "below," "beneath", and "next," the case of no contact therebetween may be included, unless "just" or "direct" is used.

If it is mentioned that a first element is positioned "on" a second element, it does not mean that the first element is essentially positioned above the second element in the figure. The upper part and the lower part of an object concerned may be changed depending on the orientation of the object. Consequently, the case in which a first element is positioned "on" a second element includes the case in which the first element is positioned "below" the second element as well as the case in which the first element is positioned "above" the second element in the figure or in an actual configuration.

In describing a temporal relationship, for example, when the temporal order is described as "after," "subsequent," "next," and "before," a case which is not continuous may be included, unless "just" or "direct" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

It should be understood that the term "at least one" includes all combinations related with any one item. For example, "at least one among a first element, a second element and a third element" may include all combinations of two or more elements selected from the first, second and third elements as well as each element of the first, second and third elements.

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in a co-dependent relationship.

In the drawings, the same or similar elements are denoted by the same reference numerals even though they are depicted in different drawings.

In the embodiments of the present disclosure, a source electrode and a drain electrode are distinguished from each other, for convenience of explanation. However, the source electrode and the drain electrode are used interchangeably. Thus, the source electrode may be the drain electrode, and the drain electrode may be the source electrode. Also, the source electrode in any one embodiment of the present disclosure may be the drain electrode in another embodiment of the present disclosure, and the drain electrode in any one embodiment of the present disclosure may be the source electrode in another embodiment of the present disclosure.

In one or more embodiments of the present disclosure, for convenience of explanation, a source region is distinguished from a source electrode, and a drain region is distinguished from a drain electrode. However, embodiments of the present disclosure are not limited to this structure. For example, a source region may be a source electrode, and a drain region may be a drain electrode. Also, a source region may be a drain electrode, and a drain region may be a source electrode.

FIG. 1 is a cross sectional view illustrating a thin film transistor 100 according to one embodiment of the present disclosure.

Referring to FIG. 1, the thin film transistor 100 according to one embodiment of the present disclosure includes a first insulating layer 120, an active layer 130, and a gate electrode 160 on a substrate 110.

The substrate 110 may be formed of glass or plastic. For example, the substrate 110 may be formed of a transparent plastic material having flexibility, for example, polyimide.

A light shielding layer 180 is disposed on the substrate 110. The light shielding layer 180 blocks incident light from the substrate 110, to thereby protect the active layer 130. If another structure serves as a light-blocking functional element, the light shielding layer 180 is omittable.

The first insulating layer 120 is disposed on the substrate 110 and the light shielding layer 180.

The first insulating layer 120 has the insulating properties, and protects the active layer 130. The first insulating layer 120 is referred to as a buffer layer.

Referring to FIG. 1, the first insulating layer 120 may include an Epi-oxide layer 122. Also, the first insulating layer 120 may further include a chemical vapor deposition (CVD) layer 121 disposed between the substrate 110 and the Epi-oxide layer 122.

The CVD layer 121 may be manufactured by a chemical vapor deposition (CVD) method. The Epi-oxide layer 122 may be manufactured by an atomic layer deposition (ALD) method or a metal organic chemical vapor deposition (MOCVD) method.

The first insulating layer 120 may include at least one among materials having the insulating properties, for example, silicon oxide (SiOx), silicon nitride (SiNx), hafnium oxide (HfOx), aluminum oxide (AlOx), zirconium oxide (ZrOx), hafnium silicate (Hf-SiOx), and zirconium silicate (Zr-SiOx).

In detail, the CVD layer 121 may include at least one of silicon oxide (SiOx) and silicon nitride (SiNx). The CVD layer 121 protects the active layer 130, and insulates the light shielding layer 180 and the active layer 130 from each other.

The epi-oxide layer 122 may include at least one among silicon oxide (SiOx), hafnium oxide (HfOx), aluminum oxide (AlOx), zirconium oxide (ZrOx), hafnium silicate (Hf-SiOx), and zirconium silicate (Zr-SiOx).

According to one embodiment of the present disclosure, an upper surface of the first insulating layer 120 which contacts the active layer 130 is an oxygen (O) layer made of oxygen (O). Referring to FIG. 1, an upper surface of the Epi-oxide layer 122 which contacts the active layer 130 may be an oxygen (O) layer made of oxygen (O).

In order to make the upper surface of the first insulating layer 120 be the oxygen (O) layer, the upper surface of the first insulating layer 120 may be treated with oxygen. For example, when the Epi-oxide layer 122 is manufactured by the ALD method, the surface of the Epi-oxide layer 122 is treated with oxygen (02) gas for a final step, whereby the upper surface of the Epi-oxide layer 122 becomes the oxygen (O) layer. When the Epi-oxide layer 122 is manufactured by the MOCVD method, the surface of the Epi-oxide layer 122 is treated with oxygen (02) gas for a final step, whereby the upper surface of the Epi-oxide layer 122 becomes the oxygen (O) layer.

The oxygen (O) parts arranged on the upper surface of the first insulating layer 120 may be a basic material for an epitaxial growth of the oxide semiconductor materials included in the active layer 130. Accordingly, the active layer 130 may have a single crystal structure. In detail, the Epi-oxide layer 122 enables an epitaxial growth of the active layer 130. In more detail, the active layer 130 may be epitaxial-grown in accordance with an atomic arrangement of the Epi-oxide layer 122, which is an oxide layer disposed in an upper portion of the first insulating layer 120. Thus, according to one embodiment of the present disclosure, the oxide layer disposed in the upper portion of the first insulating layer 120 is referred to as the Epi-oxide layer 122.

The active layer 130 is disposed on the first insulating layer 120. In more detail, the active layer 130 is disposed on the Epi-oxide layer 122. According to one embodiment of the present disclosure, the Epi-oxide layer 122 contacts the active layer 130.

The active layer 130 includes an oxide semiconductor material. According to one embodiment of the present disclosure, the active layer 130 is an oxide semiconductor layer formed of the oxide semiconductor material. Also, the active layer 130 has the single crystal structure. According to one embodiment of the present disclosure, the single crystal indicates a solid matter whose entire crystallization is regularly generated in accordance with a fixed crystal axis.

Figure 5:
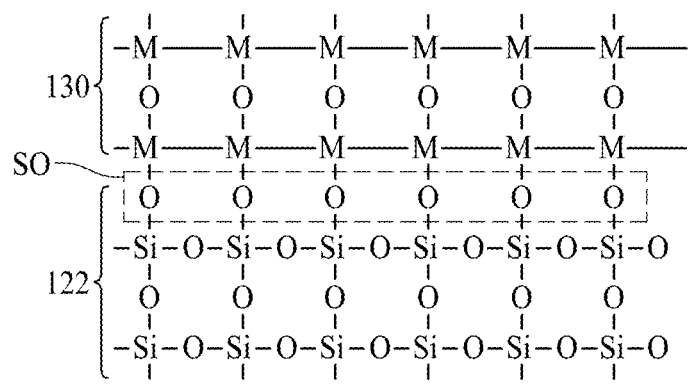
FIG. 5 is a concept view for a boundary area between a first insulating layer and an active layer.

According to one embodiment of the present disclosure, the active layer 130 formed of the oxide semiconductor material includes a metal element (M), wherein the metal element (M) of a lower surface of the active layer 130 is combined with the oxygen (O) included in the oxygen layer on the upper surface of the first insulating layer 120 (See FIG. 5).

In more detail, the metal element (M) of the lower surface of the active layer 130 is combined with the oxygen (O) included in the oxygen (O) layer formed on the upper surface of the Epi-oxide layer 122.

After the metal element (M) of the lower surface of the active layer 130 is firstly combined with the oxygen (O) on the upper surface of the Epi-oxide layer 122, the crystallization is continuously grown so that it enables the epitaxial growth of the oxide semiconductor materials.

In detail, in case of the active layer 130, the metal element (M) functions as a precursor which is combined with the oxygen (O) on the upper surface of the Epi-oxide layer 122, whereby a film is formed by the oxygen (0$_2$) and the metal element (M), and the epitaxial growth by the oxide semiconductor materials may be possible. As a result, the active layer 130 may have the single crystal structure.

For the epitaxial growth of the oxide semiconductor materials included in the active layer 130, the active layer 130 may be manufactured by the ALD method.

The entire upper surface of the Epi-oxide layer 122 corresponding to the upper surface of the first insulating layer 120 is treated with oxygen (0$_2$), and the metal element (M) which functions as the precursor is forced to be sufficiently combined with the oxygen (O) on the upper surface of the Epi-oxide layer 122, and then the oxygen (0$_2$) and the metal element (M), which are provided to form the oxide semiconductor layer, are applied step by step, whereby the single crystal of the oxide semiconductor layer may be made on a large sized area without a high temperature heat treatment.

Thus, according to one embodiment of the present disclosure, the single crystal structure of the oxide semiconductor material may be formed at a low temperature on a large sized area.

The oxide semiconductor layer having the single crystal structure may have greater field effect mobility in comparison to that of an oxide semiconductor layer having a polycrystalline structure or an amorphous structure. As a result, the thin film transistor 100 according to one embodiment of the present disclosure may have a good field effect mobility.

The active layer 130 may include at least one among oxide semiconductor materials, for example, ZO(ZnO)-based oxide semiconductor, IZO(InZnO)-based oxide semiconductor, IGZO(InGaZnO)-based oxide semiconductor, TO(SnO)-based oxide semiconductor, IGO(InGaO)-based oxide semiconductor, ITO(InSnO)-based oxide semiconductor, IGZTO(InGaZnSnO)-based oxide semiconductor, GZTO(GaZnSnO)-based oxide semiconductor, GZO(GaZnO)-based oxide semiconductor, GO(GaO)-based oxide semiconductor, IO(InO)-based oxide semiconductor, and ITZO(InSnZnO)-based oxide semiconductor. In more detail, the active layer 130 may include at least one among ZO(ZnO)-based oxide semiconductor, IZO(InZnO)-based oxide semiconductor, IGZO(InGaZnO)-based oxide semiconductor, and TO(SnO)-based oxide semiconductor.

Figure 3:
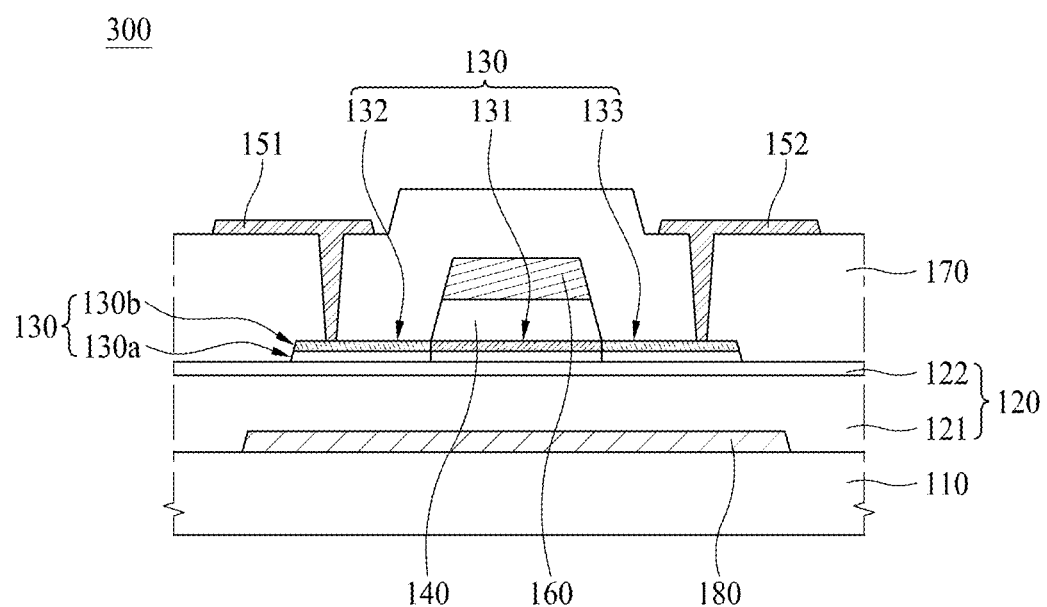
FIG. 3 is a cross sectional view illustrating a thin film transistor according to another embodiment of the present disclosure.

In addition, the active layer 130 may have a single-layered structure, or a multi-layered structure comprising a plurality of oxide semiconductor layers (See FIG. 3).

A second insulating layer 140 is disposed on the active layer 130. The second insulating layer 140 may include at least one of a silicon oxide and a silicon nitride, or may include a metal oxide or a metal nitride. The second insulating layer 140 may have a single-layered structure or a multi-layered structure.

For example, the second insulating layer 140 may include at least one among silicon oxide (SiOx), hafnium oxide (HfOx), aluminum oxide (AlOx), zirconium oxide (ZrOx), hafnium silicate (Hf-SiOx), and zirconium silicate (Zr-SiOx). The single crystal structure of the active layer 130 may be efficiently protected and maintained by the second insulating layer 140.

The second insulating layer 140 of FIG. 1, which is disposed between the active layer 130 and the gate electrode 160, may be referred to as a gate insulating film. The second insulating layer 140 may be manufactured by an atomic layer deposition (ALD) method or a metal organic chemical vapor deposition (MOCVD) method. Thus, according to one embodiment of the present disclosure, the first insulating layer 120, the active layer 130, and the second insulating layer 140, which are disposed between the substrate 110 and the gate electrode 160, may be manufactured by the ALD method, or may be manufactured by the MOCVD method. In this case, the active layer 130 may have the single crystal structure.

The gate electrode 160 is disposed on the second insulating layer 140. The gate electrode 160 is insulated from the active layer 130, and at least a portion of the gate electrode 160 is overlapped with the active layer 130.

Referring to FIG. 1, the first insulating layer 120 is disposed between the substrate 110 and the active layer 130, and the active layer 130 is disposed between the first insulating layer 120 and the gate electrode 160.

The gate electrode 160 may include at least one among aluminum-based metal such as aluminum (Al) or aluminum alloy, argentums-based metal such as argentums (Ag) or argentums alloy, copper-based metal such as copper (Cu) or copper alloy, molybdenum-based metal such as molybdenum or molybdenum alloy, chrome (Cr), tantalum (Ta), neodymium (Nd), and titanium (Ti). The gate electrode 160 may have a multi-layered structure including at least two conductive layers with the different physical properties.

An insulating interlayer 170 is disposed on the gate electrode 160. The insulating interlayer 170 is an insulating layer formed of an insulating material. In detail, the insulating interlayer 170 may be formed of an organic material, an inorganic material, or a deposition structure comprising an organic material and an inorganic material.

A source electrode 151 and a drain electrode 152 are disposed on the insulating interlayer 170. The source electrode 151 and the drain electrode 152 are spaced apart from each other, and are respectively connected with the active layer 130. The source electrode 151 and the drain electrode 152 are respectively connected with the active layer 130 through contact holes provided in the insulating interlayer 170.

Each of the source electrode 151 and the drain electrode 152 may include at least one among molybdenum (Mo), aluminum (Al), chrome (Cr), aurum (Au), titanium (Ti), nickel (Ni), neodymium (Nd), copper (Cu), and their alloys. Each of the source electrode 151 and the drain electrode 152 may be formed in a single-layered structure including the above metal or its alloy, or may be formed in a multi-layered structure including at least two layers of the above metal or its alloy.

According to one embodiment of the present disclosure, the active layer 130 may be selectively provided with conductivity by a selective conductivity providing process using the gate electrode 160 as a mask.

A portion of the active layer 130, which is overlapped with the gate electrode 160, is not provided with conductivity, and thus becomes a channel portion 131. Some portions of the active layer 130, which are not overlapped with the gate electrode 160, are provided with conductivity, and thus become conducting portions 132 and 133. The conducting portions 132 and 133 are provided at both sides of the channel portion 131, generally.

According to one embodiment of the present disclosure, for example, the active layer 130 may be selectively provided with conductivity by a plasma treatment or a dry etch.

However, one embodiment of the present disclosure is not limited to the above. The active layer 130 may be selectively provided with conductivity by a doping process using dopant. In this case, a doped region may be provided with conductivity. For the doping process, at least one among boron (B) ion, phosphorous (P) ion, arsenic (As) ion, and antimony (Sb) ion may be used for the doping process.

In addition, the active layer 130 may be selectively provided with conductivity by a photo-irradiation process.

Any one of the conducting portions 132 and 133 becomes a source region, and the other becomes a drain region. The source region, which corresponds to the first conducting portion 132, may function as a source connection portion connected with the source electrode 151, and the drain region, which corresponds to the second conducting portion 133, may function as a drain connection portion connected with the drain electrode 152.

The source region and the drain region shown in the drawings are distinguished from each other, for convenience of explanation. The source region and the drain region may be used interchangeably. According to a voltage, the source region shown in the drawings may become the drain region, and the drain region may become the source region. Also, if needed, the source region may become the source electrode 151 or the drain electrode 152, and the drain region may become the drain electrode 152 or the source electrode 151.

Referring to FIG. 1, the active layer 130 is disposed between the first insulating layer 120 and the gate electrode 160, or the active layer 130 may be disposed between the substrate 110 and the gate electrode 160. As shown in FIG. 1, a structure where the gate electrode 160 is disposed above the active layer 130 is referred to as a top gate structure.

Figure 2:
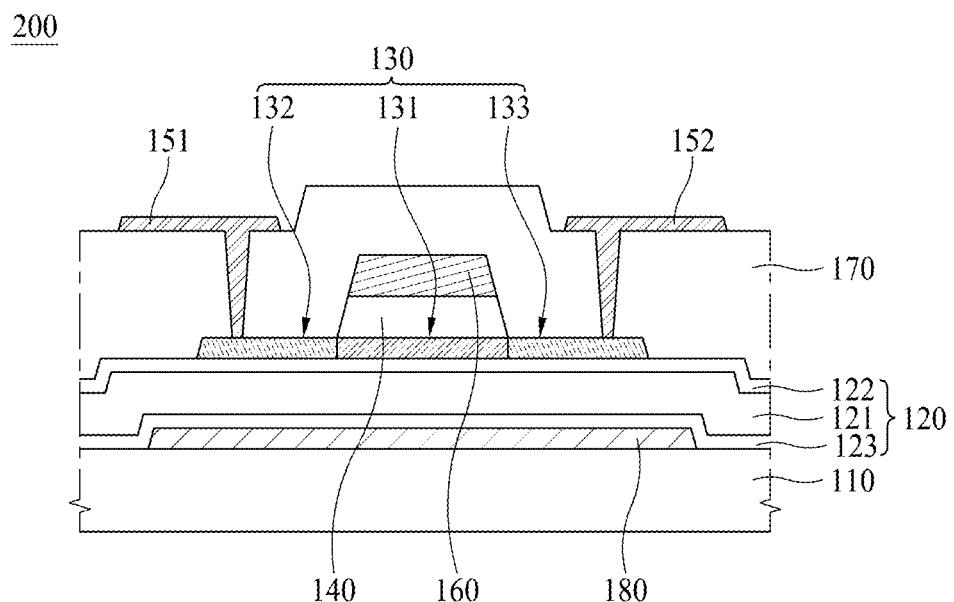
FIG. 2 is a cross sectional view illustrating a thin film transistor according to another embodiment of the present disclosure.

FIG. 2 is a cross sectional view illustrating a thin film transistor 200 according to another embodiment of the present disclosure.

Referring to FIG. 2, a first insulating layer 120 further includes an ALD layer 123 disposed between a CVD layer 121 and a substrate 110.

According to another embodiment of the present disclosure, an Epi-oxide layer 122 which is disposed on the CVD layer 121 and contacts an active layer 130 is referred to as an "upper ALD layer" or a "first ALD layer", and the ALD layer 123 disposed between the CVD layer 121 and the substrate 110 may be referred to as a "lower ALD layer" or a "second ALD layer". Alternatively, the Epi-oxide layer 122 may be referred to as a MOCVD layer.

Generally, the ALD layer has a regular atomic arrangement. Thus, according as the ALD layer 123 which contacts the substrate 110 is disposed between the CVD layer 121 and the substrate 110, it is possible to provide the good circumstances for the regular atomic arrangement of the CVD layer 121 and the Epi-oxide layer 122 which are disposed on the ALD layer 123. As a result, an epitaxial growth of an oxide semiconductor material included in the active layer 130 becomes smooth so that the active layer 130 may have a single crystal structure with a good uniformity.

FIG. 3 is a cross sectional view illustrating a thin film transistor 300 according to another embodiment of the present disclosure.

Referring to FIG. 3, an active layer 130 includes a first oxide semiconductor layer 130a, and a second oxide semiconductor layer 130b on the first oxide semiconductor layer 130a.

The first oxide semiconductor layer 130a is disposed on a first insulating layer 120, and the first oxide semiconductor layer 130a serves as a support layer for supporting the second oxide semiconductor layer 130b. The second oxide semiconductor layer 130b may function as a main channel layer.

The first oxide semiconductor layer 130a which serves as the support layer may have a good film stability and a good mechanical stability. For example, the first oxide semiconductor layer 130a may include at least one among oxide semiconductor materials, for example, IGZO(InGaZnO)-based oxide semiconductor material, IGO(InGaO)-based oxide semiconductor material, IGZTO(InGaZnSnO)-based oxide semiconductor material, GZTO(GaZnSnO)-based oxide semiconductor material, GZO(GaZnO)-based oxide semiconductor material, and GO(GaO)-based oxide semiconductor material. However, one embodiment of the present disclosure is not limited to the above. The first oxide semiconductor layer 130a may be formed of other oxide semiconductor materials generally known to those in the art.

For example, the second oxide semiconductor layer 130b may be formed of IZO(InZnO)-based oxide semiconductor material, TO(SnO)-based oxide semiconductor material, IGO(InGaO)-based oxide semiconductor material, ITO(InSnO)-based oxide semiconductor material, IGZO(InGaZnO)-based oxide semiconductor material, IGZTO(InGaZnSnO)-based oxide semiconductor material, GZTO (GaZnSnO)-based oxide semiconductor material, ITZO (InSnZnO)-based oxide semiconductor material, and IO(InO)-based oxide semiconductor material. However, one embodiment of the present disclosure is not limited to the above. The second oxide semiconductor layer 130b may be formed of other oxide semiconductor materials generally known to those in the art.

Figure 4:
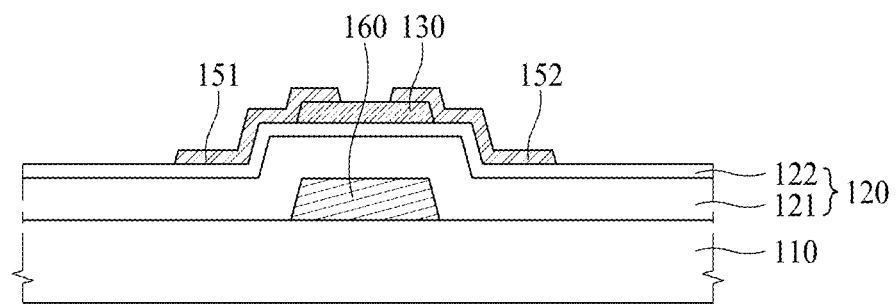
FIG. 4 is a cross sectional view illustrating a thin film transistor according to another embodiment of the present disclosure.

FIG. 4 is a cross sectional view illustrating a thin film transistor 400 according to another embodiment of the present disclosure.

The thin film transistor 400 of FIG. 4 includes a gate electrode 160 on a substrate 110, a first insulating layer 120 on the gate electrode 160, an active layer 130 on the first insulating layer 120, a source electrode 151 connected with the active layer 130, and a drain electrode 152 spaced apart from the source electrode 151 and connected with the active layer 130.

The active layer 130 has a single crystal structure formed of an oxide semiconductor material.

The first insulating layer 120 may include a CVD layer 121, and an Epi-oxide layer 122 on the CVD layer 121. An upper surface of the first insulating layer 120 which contacts the active layer 130 is an oxygen (O) layer formed of oxygen (O). An upper surface of the Epi-oxide layer 122 which contacts the active layer 130 may be an oxygen (O) layer formed of oxygen (O).

Referring to FIG. 4, the first insulating layer 120 is disposed between the substrate 110 and the active layer 130, and the gate electrode 160 is disposed between the substrate 110 and the first insulating layer 120.

As shown in FIG. 4, a structure where the gate electrode 160 is disposed below the active layer 130 is referred to as a bottom gate structure. According to one embodiment of the present disclosure, the active layer 130 having the single crystal structure may be applied to the thin film transistor 400 of the bottom gate structure.

FIG. 5 is a conceptual view for the boundary area between the first insulating layer 120 and the active layer 130.

In detail, FIG. 5 shows an upper portion of the Epi-oxide layer 122 included in the first insulating layer 120, and a lower portion of the active layer 130.

Referring to FIG. 5, the upper portion of the first insulating layer 120 is the Epi-oxide layer 122, and an upper surface of the Epi-oxide layer 122 is an oxygen (O) layer formed of oxygen (O). The upper surface of the Epi-oxide layer 122 is a surface which contacts the active layer 130.

When the Epi-oxide layer 122 is manufactured by an atomic layer deposition (ALD) method, a surface of the Epi-oxide layer 122 is treated with oxygen (02) gas for a final step, whereby the upper surface of the Epi-oxide layer 122 becomes the oxygen (O) layer. When the Epi-oxide layer 122 is manufactured by a metal organic chemical vapor deposition (MOCVD) method, a surface of the Epi-oxide layer 122 is treated with oxygen (02) gas for a final step, whereby the upper surface of the Epi-oxide layer 122 becomes the oxygen (O) layer.

Referring to FIG. 5, the active layer 130 is disposed on the Epi-oxide layer 122, and a metal element (M) of a lower surface of the active layer 130 is combined with the oxygen (O) on the upper surface of the Epi-oxide layer 122.

The metal element (M) of the lower surface of the active layer 130 functions as a precursor which is combined with the oxygen (O) on the upper surface of the Epi-oxide layer 122, whereby an oxygen layer is formed of a film made by the oxygen (02) on the metal element (M) functioning as the precursor, and a metal layer is formed by a film made by the metal element (M). Thus, an epitaxial growth is made by oxide semiconductor materials, whereby it is possible to form the active layer 130 having the single crystal structure.

The oxygen (O) layer on the upper surface of the first insulating layer 120 may be a basic material for an epitaxial growth of the oxide semiconductor materials included in the active layer 130. For the epitaxial growth of the oxide semiconductor materials included in the active layer 130, the active layer 130 may be manufactured by the ALD method. Also, the active layer 130 may be manufactured by the MOCVD method.

In accordance with these methods, according to one embodiment of the present disclosure, the single crystal of the oxide semiconductor material may be made at a low temperature on a large sized area without a high temperature heat treatment above 500° C.

Figure 6A:
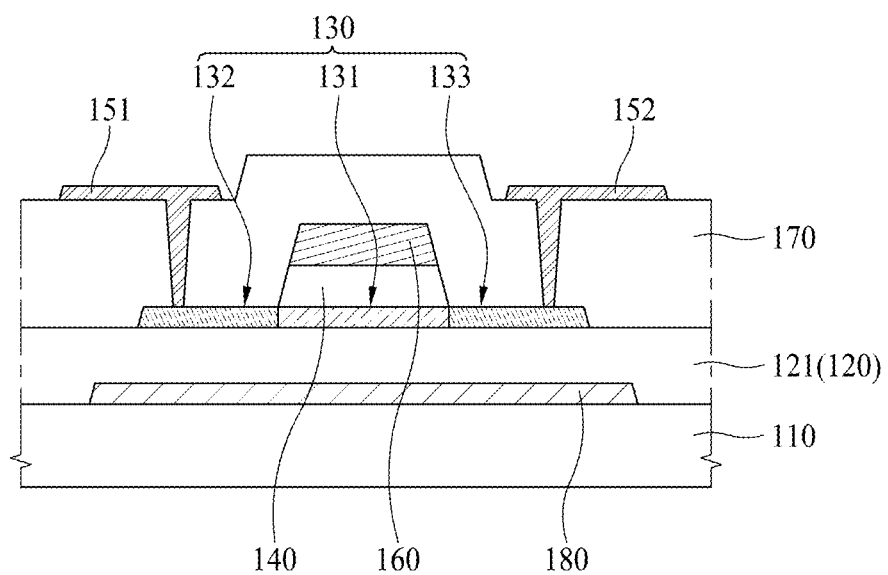
FIG. 6A is a cross sectional view illustrating a thin film transistor according to a comparative example.

FIG. 6A is a cross sectional view illustrating a thin film transistor according to a comparative example.

A first insulating layer 120 of the thin film transistor according to the comparative example shown in FIG. 6A is not provided with an Epi-oxide layer 122. Referring to FIG. 6A, the first insulating layer 120 is provided with a CVD layer 121.

According as the first insulating layer 120 is not provided with the Epi-oxide layer 122, the thin film transistor according to the comparative example shown in FIG. 6A is not provided with a layer which functions as a basic material for an epitaxial growth of oxide semiconductor materials included in an active layer 130. As a result, in case of the thin film transistor according to the comparative example, the oxide semiconductor materials included in the active layer 130 are not epitaxial-grown so that the active layer 130 does not have a single crystal structure.

In case of the thin film transistor according to the comparative example shown in FIG. 6A, the active layer 130 has an IZO(InZnO)-based oxide semiconductor layer. The thin film transistor according to the comparative example has 52.63 cm$^2$/Vs field effect mobility (μFE). The thin film transistor according to the comparative example does not have a good field effect mobility.

Figure 6B:
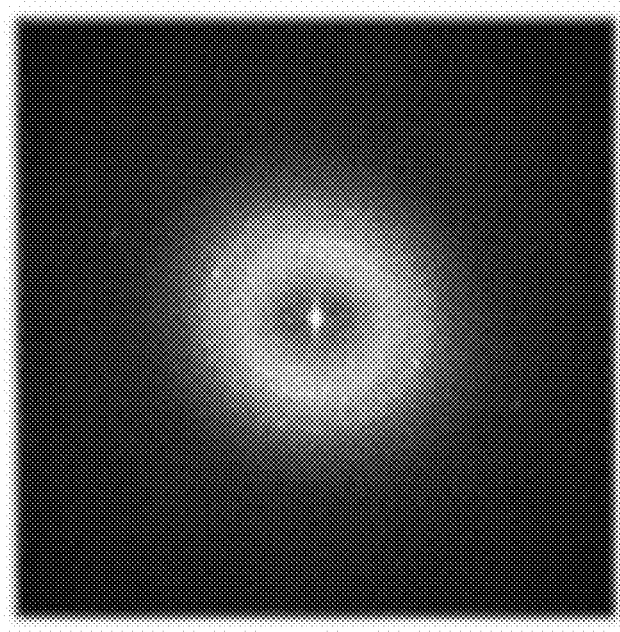
FIG. 6B is a transmission electron microscope (TEM) photograph for an active layer of the thin film transistor according to the comparative example shown in FIG. 6A.

FIG. 6B is a transmission electron microscope (TEM) photograph for the active layer of the thin film transistor according to the comparative example shown in FIG. 6A. Referring to FIG. 6B, in case of the thin film transistor according to the comparative example, the active layer does not have the good crystallization, and also does not have the single crystal structure.

In case of the thin film transistor according to one embodiment of the present disclosure, the first insulating layer 120 has the Epi-oxide layer 122, and the active layer 130 has the single crystal structure of the IZO(InZno)-based oxide semiconductor material. The thin film transistor according to one embodiment of the present disclosure has 58.41 cm$^2$/Vs field effect mobility (μFE). In comparison to the thin film transistor according to the comparative example, the thin film transistor according to one embodiment of the present disclosure has the greater field effect mobility.

Figure 7:
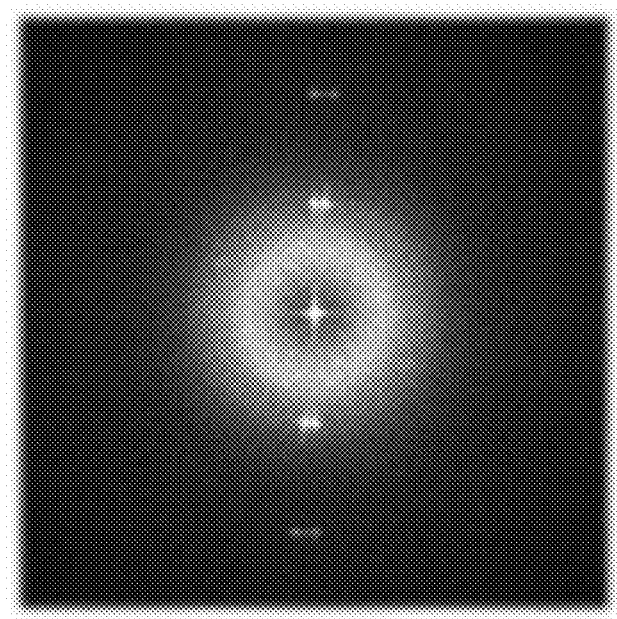
FIG. 7 is a transmission electron microscope (TEM) photograph for an active layer of the thin film transistor according to one embodiment of the present disclosure.

FIG. 7 is a transmission electron microscope (TEM) photograph for the active layer of the thin film transistor according to one embodiment of the present disclosure. Referring to FIG. 7, it is shown that the active layer included in the thin film transistor according to the present disclosure has the good crystallization. Referring to FIG. 7, the active layer included in the thin film transistor according to the present disclosure may have the single crystal structure by the epitaxial growth.

Figure 8:
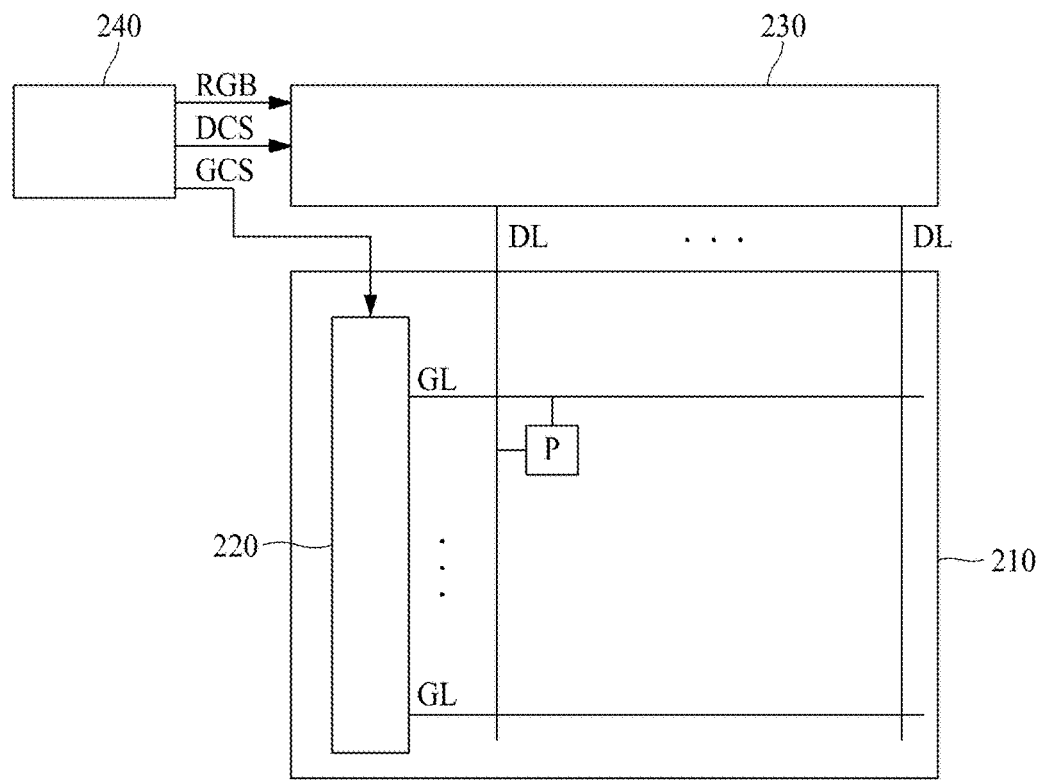
FIG. 8 is a schematic view illustrating a display apparatus according to another embodiment of the present disclosure.

FIG. 8 is a schematic view illustrating a display apparatus 500 according to another embodiment of the present disclosure.

The display apparatus 500 according to another embodiment of the present disclosure, as shown in FIG. 8, includes a display panel 210, a gate driver 220, a data driver 230, and a controller 240.

On the display panel 210, there are gate lines (GL) and data lines (DL), and a pixel (P) arranged at a crossing portion of the gate line (GL) and the data line (DL). An image is displayed by driving the pixel (P).

The controller 240 controls the gate driver 220 and the data driver 230.

The controller 240 outputs a gate control signal (GCS) for controlling the gate driver 220 and a data control signal (DCS) for controlling the data driver 230 by the use of signal supplied from an external system (not shown). Also, the controller 240 samples input video data, which is provided from the external system, and then re-aligns the sampled video data, and supplies the re-aligned digital video data (RGB) to the data driver 230.

The gate control signal (GCS) includes a gate start pulse (GSP), a gate shift clock (GSC), a gate output enable signal (GOE), a start signal (Vst), and a gate clock (GCLK). Also, control signals for controlling a shift register may be included in the gate control signal (GCS).

The data control signal (DCS) includes a source start pulse (SSP), a source shift clock signal (SSC), a source output enable signal (SOE), and a polarity control signal (POL).

The data driver 230 supplies a data voltage to the data lines (DL) of the display panel 210. In detail, the data driver 230 converts the video data (RGB) provided from the controller 240 into an analog data voltage, and supplies the analog data voltage to the data lines (DL).

The gate driver 220 sequentially supplies a gate pulse (GP) to the gate lines (GL) for 1 frame period. Herein, '1 frame' indicates the period in which one image is output through the display panel. Also, the gate driver 220 supplies a gate-off signal for turning off the switching device to the gate line (GL) for the remaining period of 1 frame in which the gate pulse (GP) is not supplied. Hereinafter, the gate pulse (GP) and the gate-off signal (Goff) are totally referred to as scan signals (SS).

According to one embodiment of the present disclosure, the gate driver 220 may be provided on a substrate 110. A structure of directly providing the gate driver 220 on the substrate 110 may be referred to as Gate-In-Panel (GIP) structure.

Figure 9:
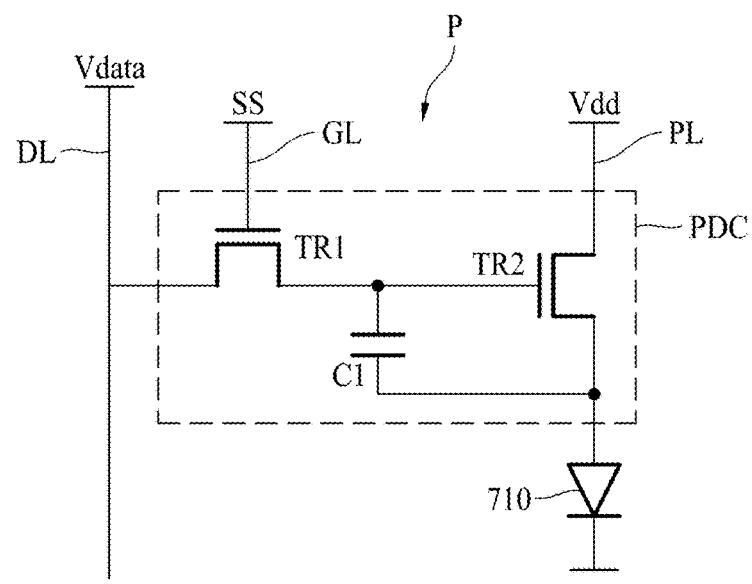
FIG. 9 is a circuit diagram illustrating any one pixel (P) of FIG. 8 according to an embodiment of the present disclosure.
Figure 10:
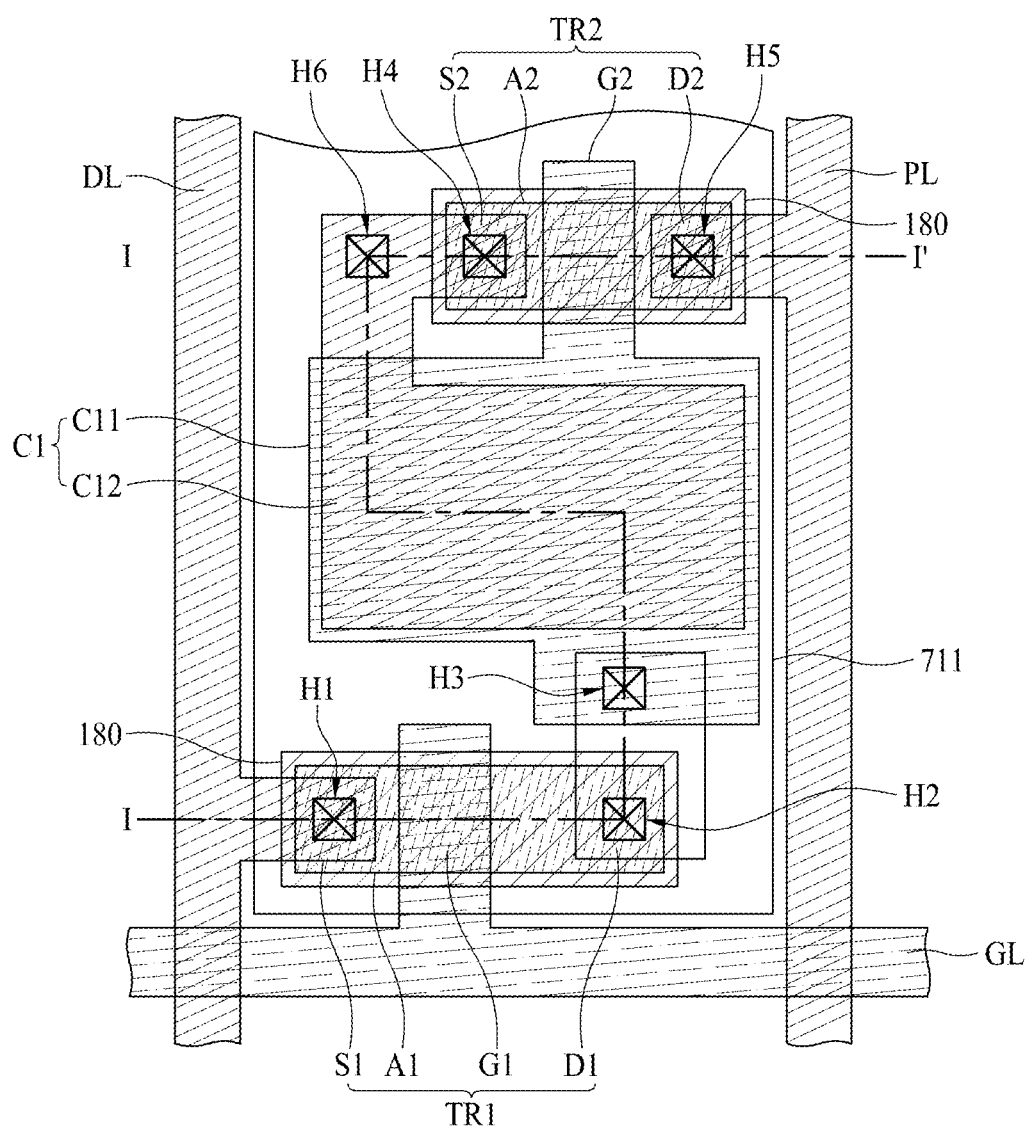
FIG. 10 is a plan view illustrating the pixel (P) of FIG. 8 according to an embodiment of the present disclosure.
Figure 11:
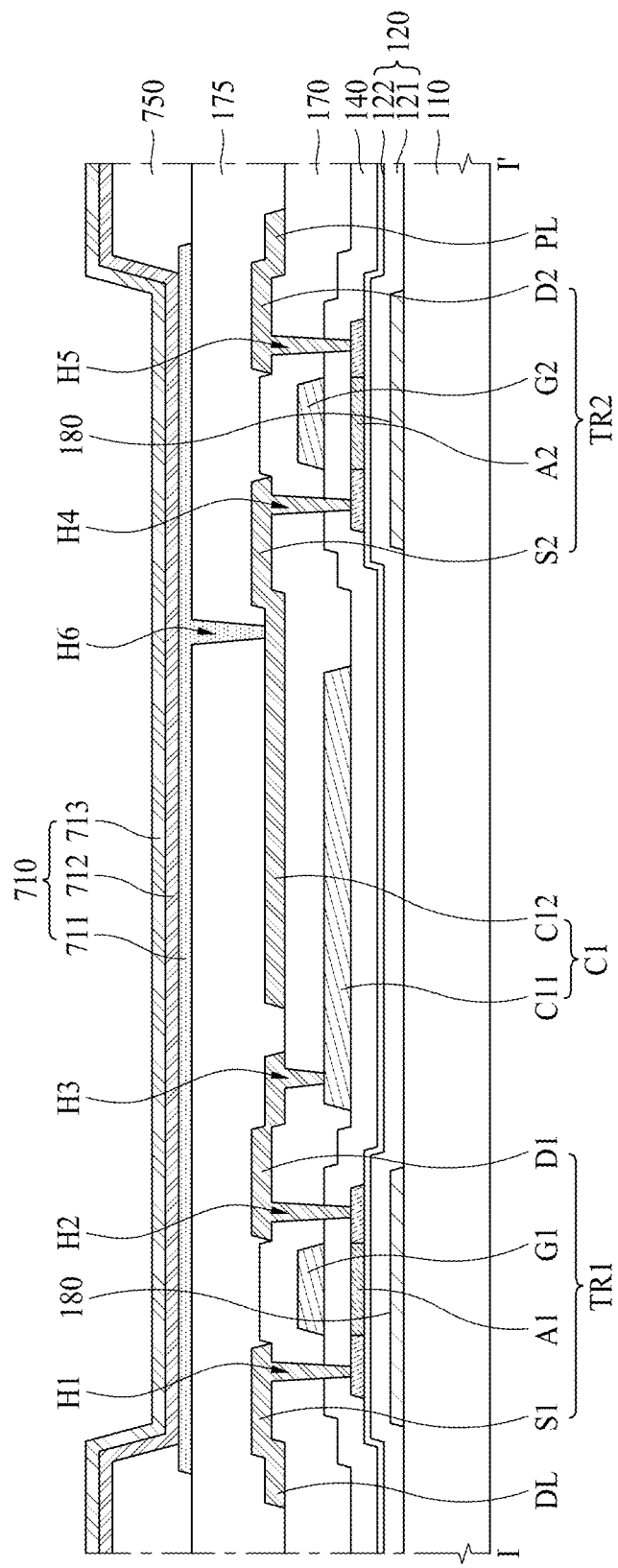
FIG. 11 is a cross sectional view along I-I' of FIG. 10 according to an embodiment of the present disclosure.

FIG. 9 is a circuit diagram illustrating any one pixel (P) of FIG. 8, FIG. 10 is a plan view illustrating the pixel (P) of FIG. 8, and FIG. 11 is a cross sectional view along I-I' of FIG. 10 according to one embodiment of the present disclosure.

The circuit diagram of FIG. 9 is an equivalent circuit diagram for one pixel (P) in the display apparatus 500 comprising an organic light emitting diode (OLED) functioning as a display device 710.

The pixel (P) includes the display device 710, and a pixel driver (PDC) for driving the display device 710.

The pixel driver (PDC) of FIG. 9 includes a first thin film transistor (TR1) corresponding to a switching transistor, and a second thin film transistor (TR2) corresponding to a driving transistor. Each of the thin film transistors 100, 200, 300 and 400 shown in FIGS. 1, 2, 3 and 4 may be used for the first thin film transistor (TR1) and the second thin film transistor (TR2).

The first thin film transistor (TR1) is connected with the gate line (GL) and the data line (DL), and the first thin film transistor (TR1) is turned-on or turned-off by the scan signal (SS) supplied through the gate line (GL).

The data line (DL) provides the data voltage (Vdata) to the pixel driver (PDC), and the first thin film transistor (TR1) controls applying the data voltage (Vdata).

A driving power line (PL) provides a driving voltage (Vdd) to the display device 710, and the second thin film transistor (TR2) controls the driving voltage (Vdd). Herein, the driving voltage (Vdd) is a pixel driving voltage for driving the organic light emitting diode (OLED) corresponding to the display device 710.

When the first thin film transistor (TR1) is turned-on by the scan signal (SS) applied through the gate line (GL) from the gate driver 220, the data voltage (Vdata), which is supplied through the data line (DL), is supplied to a gate electrode (G2) of the second thin film transistor (TR2) connected with the display device 710. The data voltage (Vdata) is charged in a first capacitor (C1) provided between a source electrode (S2) and a gate electrode (G2) of the second thin film transistor (TR2). The first capacitor (C1) is a storage capacitor (Cst).

An amount of current supplied to the organic light emitting diode (OLED) corresponding to the display device 710 through the second thin film transistor (TR2) is controlled in accordance with the data voltage (Vdd), whereby it is possible to control a grayscale of light emitted from the display device 710.

Referring to FIGS. 10 and 11, the first thin film transistor (TR1) and the second thin film transistor (TR2) are provided on the substrate 110.

The substrate 110 may be formed of glass or plastic. The substrate 110 may be formed of plastic having flexibility, for example, polyimide (PI).

A light shielding layer 180 is disposed on the substrate 110. The light shielding layer 180 may function as a light blocking layer. The light shielding layer 180 blocks externally-provided incident light, to thereby protect an active layer (A1) of the first thin film transistor (TR1), and an active layer (A2) of the second thin film transistor (TR2).

A first insulating layer 120 is disposed on the light shielding layer 180. The first insulating layer 120 is formed of an insulating material, and the first insulating layer 120 protects the active layers (A1, A2) from externally-provided moisture or oxygen.

Referring to FIG. 11, the first insulating layer 120 includes a CVD layer 121, and an Epi-oxide layer 122 on the CVD layer 121. The CVD layer 121 may be manufactured by a chemical vapor deposition (CVD) method. The Epi-oxide layer 122 may be manufactured by an atomic layer deposition (ALD) method or a metal organic chemical vapor deposition (MOCVD) method.

The CVD layer 121 may include at least one of silicon oxide (SiOx) and silicon nitride (SiNx). The Epi-oxide layer 122 may include at least one among silicon oxide (SiOx), hafnium oxide (HfOx), aluminum oxide (AlOx), zirconium oxide (ZrOx), hafnium silicate (Hf-SiOx), and zirconium silicate (Zr-SiOx).

According to another embodiment of the present disclosure, an upper surface of the first insulating layer 120 which contacts the active layer (A1, A2) is an oxygen (O) layer formed of oxygen (O). Referring to FIG. 11, an upper surface of the Epi-oxide layer 122 which contacts the active layer (A1, A2) may be an oxygen (O) layer formed of oxygen (O).

In order to make the upper surface of the first insulating layer 120 be the oxygen (O) layer, the upper surface of the first insulating layer 120 may be treated with oxygen. For example, when the Epi-oxide layer 122 is manufactured by an ALD method, a surface of the Epi-oxide layer 122 is treated with oxygen (02) gas for a final step, whereby the upper surface of the Epi-oxide layer 122 becomes the oxygen (O) layer.

The oxygen (O) layer on the upper surface of the first insulating layer 120 may be a basic material for an epitaxial growth of oxide semiconductor materials included in the active layer (A1, A2). Accordingly, the active layer (A1, A2) may have a single crystal structure.

The active layer (A1) of the first thin film transistor (TR1) and the active layer (A2) of the second thin film transistor (TR2) are disposed on the first insulating layer 120.

The active layer (A1, A2) includes the oxide semiconductor material. According to another embodiment of the present disclosure, the active layer (A1, A2) is the oxide semiconductor layer formed of the oxide semiconductor material. The active layer (A1, A2) may have the single crystal structure. The active layer (A1, A2) may have the good field effect mobility (μFE).

According to another embodiment of the present disclosure, a metal element (M) of a lower surface of the active layer (A1, A2) is combined with the oxygen (O) included in the oxygen (O) layer on the upper surface of the Epi-oxide layer 122.

A second insulating layer 140 is disposed on the active layer (A1, A2). The second insulating layer 140 has the insulating properties. The second insulating layer 140 insulates the active layer (A1, A2) and a gate electrode (G1, G2) from each other. Thus, the second insulating layer 140 may be referred to as a gate insulating film.

The gate electrode (G1) of the first thin film transistor (TR1) and the gate electrode (G2) of the second thin film transistor (TR2) are disposed on the second insulating layer 140.

The gate electrode (G1) of the first thin film transistor (TR1) is overlapped with at least a portion of the active layer (A1) of the first thin film transistor (TR1).

The gate electrode (G2) of the second thin film transistor (TR2) is overlapped with at least a portion of the active layer (A2) of the second thin film transistor (TR2).

Referring to FIGS. 10 and 11, a first capacitor electrode (C11) of a first capacitor (C1) is disposed in the same layer as that of the gate electrode (G1, G2). The gate electrode (G1, G2) and the first capacitor electrode (C11) may be manufactured together by the same process using the same material.

An insulating interlayer 170 is disposed on the gate electrode (G1, G2) and the first capacitor electrode (C11).

A source electrode (S1, S2) and a drain electrode (D1, D2) are disposed on the insulating interlayer 170. According to one embodiment of the present disclosure, for convenience of explanation, the source electrode (S1, S2) and the drain electrode (D1, D2) are distinguished from each other. However, the source electrode (S1, S2) and the drain electrode (D1, D2) may be used interchangeably. Thus, the source electrode (S1, S2) may be the drain electrode (D1, D2), and the drain electrode (D1, D2) may be the source electrode (S1, S2).

Also, the data line (DL) and the driving power line (PL) are disposed on the insulating interlayer 170. The source electrode (S1) of the first thin film transistor (TR1) may be formed as one body with the data line (DL). The drain electrode (D2) of the second thin film transistor (TR2) may be formed as one body with the driving power line (PL).

According to one embodiment of the present disclosure, the source electrode (S1) of the first thin film transistor (TR1) and the drain electrode (D1) of the first thin film transistor (TR1) are spaced apart from each other, and are connected with the active layer (A1) of the first thin film transistor (TR1). The source electrode (S2) of the second thin film transistor (TR2) and the drain electrode (D2) of the second thin film transistor (TR2) are spaced apart from each other, and are connected with the active layer (A2) of the second thin film transistor (TR2).

In detail, the source electrode (S1) of the first thin film transistor (TR1) contacts a source region of the active layer (A1) through a first contact hole (H1).

The drain electrode (D1) of the first thin film transistor (TR1) contacts a drain region of the active layer (A1) through a second contact hole (H2), and the drain electrode (D1) of the first thin film transistor (TR1) is connected with the first capacitor electrode (C11) of the first capacitor (C1) through a third contact hole (H3).

The source electrode (S2) of the second thin film transistor (TR2) extends onto the insulating interlayer 170, whereby a portion of the source electrode (S2) functions as a second capacitor electrode (C12) of the first capacitor (C1). The first capacitor electrode (C11) and the second capacitor electrode (C12) are overlapped with each other so that it is possible to form the first capacitor (C1).

Also, the source electrode (S2) of the second thin film transistor (TR2) contacts a source region of the active layer (A2) through a fourth contact hole (H4).

The drain electrode (D2) of the second thin film transistor (TR2) contacts the drain region of the active layer (A2) through a fifth contact hole (H5).

The first thin film transistor (TR1) includes the active layer (A1), the gate electrode (G1), the source electrode (S1), and the drain electrode (D1), and the first thin film transistor (TR1) serves as the switching transistor for controlling the data voltage (Vdata) applied to the pixel driver (PDC).

The second thin film transistor (TR2) includes the active layer (A2), the gate electrode (G2), the source electrode (S2), and the drain electrode (D2), and the second thin film transistor (TR2) serves as the driving transistor for controlling the driving voltage (Vdd) applied to the display device 710.

A protection layer 175 is disposed on the source electrode (S1, S2), the drain electrode (D1, D2), the data line (DL), and the driving power line (PL). The protection layer 175 is provided to protect the first thin film transistor (TR1) and the second thin film transistor (TR2), and to planarize upper surfaces of the first thin film transistor (TR1) and the second thin film transistor (TR2).

A first electrode 711 of the display device 710 is disposed on the protection layer 175. The first electrode 711 of the display device 710 is connected with the source electrode (S2) of the second thin film transistor (TR2) through a sixth contact hole (H6).

A bank layer 750 is disposed on the edge of the first electrode 711. The bank layer 750 defines an emission area of the display device 710.

An organic emission layer 712 is disposed on the first electrode 711, and a second electrode 713 is disposed on the organic emission layer 712, whereby the display device 710 is completed. The display device 710 shown in FIG. 11 is the organic light emitting diode (OLED). Accordingly, the display apparatus 500 according to one embodiment of the present disclosure is an organic light emitting display apparatus.

Figure 12:
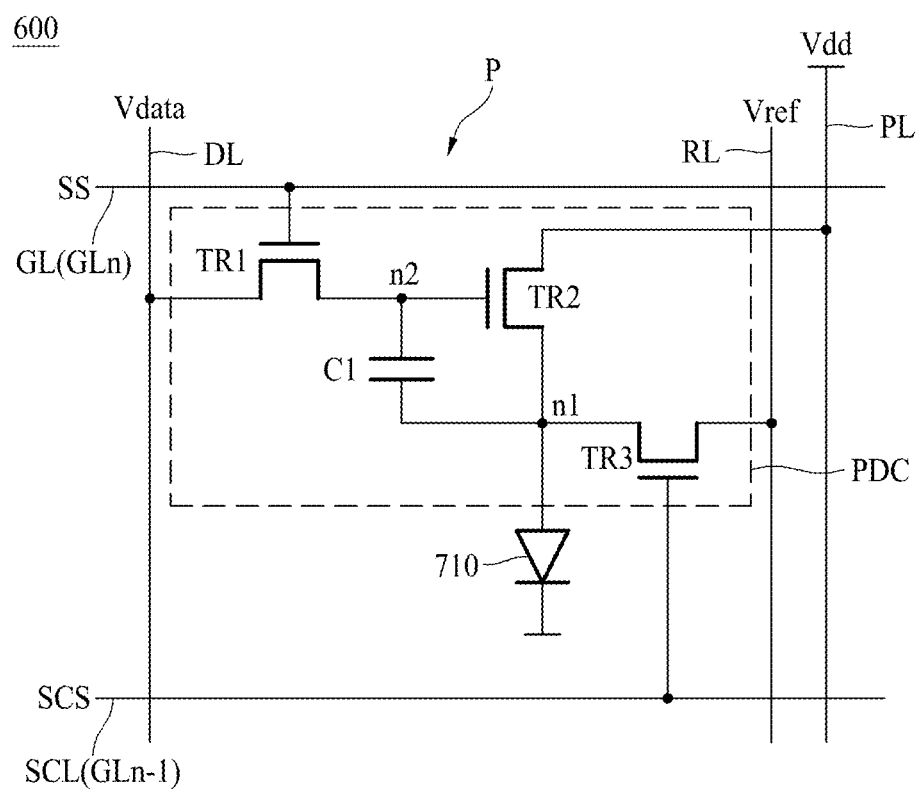
FIG. 12 is a circuit diagram for a pixel (P) of a display apparatus according to another embodiment of the present disclosure.

FIG. 12 is a circuit diagram for a pixel (P) of a display apparatus 600 according to another embodiment of the present disclosure.

FIG. 12 is an equivalent circuit diagram for a pixel (P) of an organic light emitting display apparatus.

The pixel (P) of the display apparatus 600 shown in FIG. 12 includes an organic light emitting diode (OLED) corresponding to a display device 710, and a pixel driver (PDC) configured to drive the display device 710. The display device 710 is connected with the pixel driver (PDC).

In the pixel (P), there are signal lines (DL, GL, PL, RL, SCL) configured to supply signals to the pixel driver (PDC).

A data voltage (Vdata) is supplied to a data line (DL), a scan signal (SS) is supplied to a gate line (GL), a driving voltage (Vdd) for driving the pixel is supplied to a driving power line (PL), a reference voltage (Vref) is supplied to a reference line (RL), and a sensing control signal (SCS) is supplied to a sensing control line (SCL).

Referring to FIG. 12, when the gate line of the (n)th pixel (P) is referred to as "$GL_n$", the gate line of the neighboring (n−1)th pixel (P) is "$GL_{n-1}$", and "$GL_{n-1}$" corresponding to the gate line of the (n−1)th pixel (P) serves as the sensing control line (SCL) of the (n)th pixel (P).

For example, the pixel driver (PDC) includes a first thin film transistor (TR1, switching transistor) connected with the gate line (GL) and the data line (DL), a second thin film transistor (TR2, driving transistor) configured to control a level of current which is provided to the display device 710 in accordance with the data voltage (Vdata) transmitted through the first thin film transistor (TR1), and a third thin film transistor (TR3, reference transistor) configured to sense the properties of the second thin film transistor (TR2).

A first capacitor (C1) is positioned between the display device 710 and a gate electrode (G2) of the second thin film transistor (TR2). The first capacitor (C1) is referred to as a storage capacitor (Cst).

According as the first thin film transistor (TR1) is turned-on by the scan signal (SS) supplied to the gate line (GL), the first thin film transistor (TR1) transmits the data voltage (Vdata), which is supplied to the data line (DL), to the gate electrode (G2) of the second thin film transistor (TR2).

The third thin film transistor (TR3) is connected with the reference line (RL) and a first node (n1) between the display device 710 and the second thin film transistor (TR2). The third thin film transistor (TR3) is turned-on or turned-off by the sensing control signal (SCS), and the third thin film transistor (TR3) senses the properties of the second thin film transistor (TR2) corresponding the driving transistor for a sensing period.

A second node (n2) connected with the gate electrode (G2) of the second thin film transistor (TR2) is connected with the first thin film transistor (TR1). The first capacitor (C1) is formed between the second node (n2) and the first node (n1).

When the first thin film transistor (TR1) is turned-on, the data voltage (Vdata) supplied through the data line (DL) is supplied to the gate electrode (G2) of the second thin film transistor (TR2). The first capacitor (C1) formed between a source electrode (S2) and the gate electrode (G2) of the second thin film transistor (TR2) is charged with the data voltage (Vdata).

When the second thin film transistor (TR2) is turned-on, a current is supplied to the display device 710 through the second thin film transistor (TR2) by the driving voltage (Vdd) for driving the pixel, whereby light is emitted from the display device 710.

Each of the first thin film transistor (TR1), the second thin film transistor (TR2), and the third thin film transistor (TR3) shown in FIG. 12 may have a structure which is identical to that of any one among the thin film transistors 100, 200, 300 and 400 shown in FIGS. 1, 2, 3 and 4.

Figure 13:
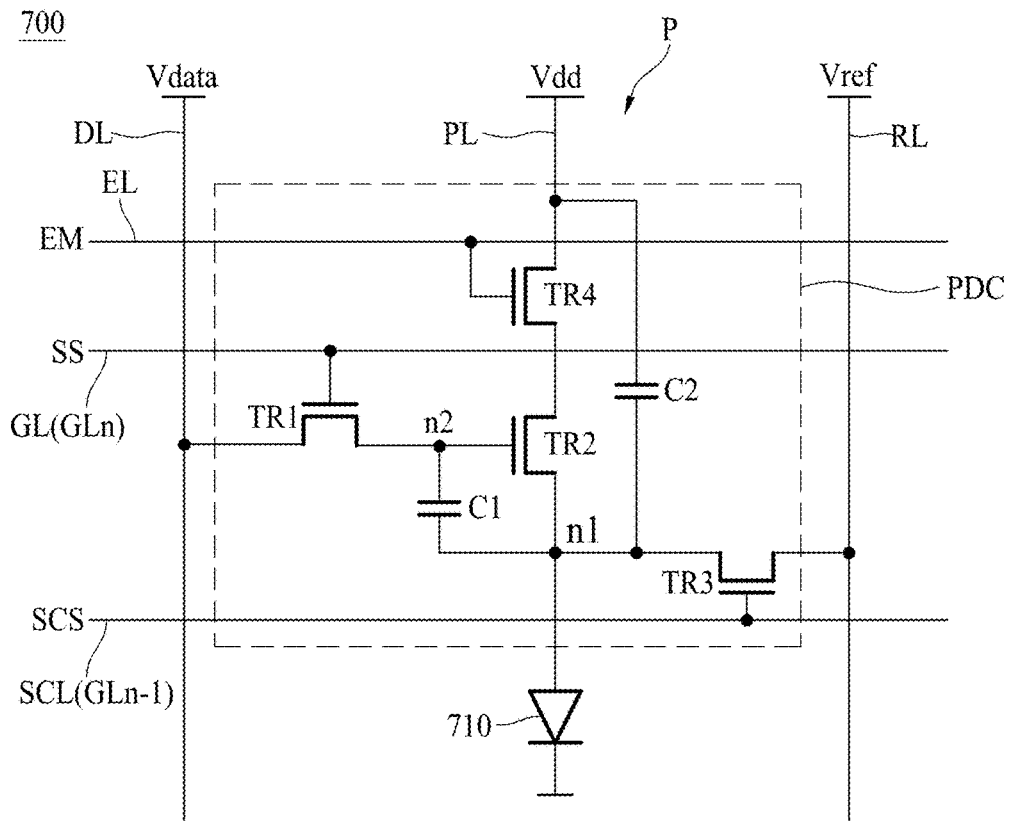
FIG. 13 is a circuit diagram for a pixel (P) of a display apparatus according to another embodiment of the present disclosure.

FIG. 13 is a circuit diagram for a pixel (P) of a display apparatus 700 according to another embodiment of the present disclosure.

The pixel (P) of the display apparatus 700 shown in FIG. 13 includes an organic light emitting diode (OLED) corresponding to a display device 710, and a pixel driver (PDC) configured to drive the display device 710. The display device 710 is connected with the pixel driver (PDC).

The pixel driver (PDC) includes thin film transistors (TR1, TR2, TR3, TR4).

In the pixel (P), there are signal lines (DL, EL, GL, PL, SCL, RL) configured to supply driving signals to the pixel driver (PDC).

In comparison to the pixel (P) of FIG. 12, the pixel (P) of FIG. 13 further includes an emission control line (EL). An emission control signal (EM) is supplied to the emission control line (EL).

Also, in comparison to the pixel driver (PDC) of FIG. 12, the pixel driver (PDC) of FIG. 13 further includes a fourth thin film transistor (TR4) corresponding to an emission control transistor configured to control a light emission time point of the second thin film transistor (TR2).

Referring to FIG. 13, when the gate line of the (n)th pixel (P) is referred to as "$GL_n$", the gate line of the neighboring (n−1)th pixel (P) is "$GL_{n-1}$", and "$GL_{n-1}$" corresponding to the gate line of the (n−1)th pixel (P) serves as the sensing control line (SCL) of the (n)th pixel (P).

A first capacitor (C1) is positioned between the display device 710 and a gate electrode (G2) of the second thin film transistor (TR2). Also, a second capacitor (C2) is positioned between one electrode of the display device 710 and a terminal supplied with a driving voltage (Vdd) among terminals of the fourth thin film transistor (TR4).

According as the first thin film transistor (TR1) is turned-on by the scan signal (SS) supplied to the gate line (GL), the first thin film transistor (TR1) transmits the data voltage (Vdata), which is supplied to the data line (DL), to the gate electrode (G2) of the second thin film transistor (TR2).

The third thin film transistor (TR3) is connected with a reference line (RL). The third thin film transistor (TR3) is turned-on or turned-off by the sensing control signal (SCS), and the third thin film transistor (TR3) senses the properties of the second thin film transistor (TR2) corresponding the driving transistor for a sensing period.

The fourth thin film transistor (TR4) transmits the driving voltage (Vdd) to the second thin film transistor (TR2), or blocks the driving voltage (Vdd) in accordance with the emission control signal (EM). When the fourth thin film transistor (TR4) is turned-on, a current is supplied to the second thin film transistor (TR2), whereby light is emitted from the display device 710.

Each of the first thin film transistor (TR1), the second thin film transistor (TR2), the third thin film transistor (TR3), and the fourth thin film transistor (TR4) shown in FIG. 13 may have a structure which is identical to that of any one among the thin film transistors 100, 200, 300 and 400 shown in FIGS. 1, 2, 3 and 4.

The pixel driver (PDC) according to another embodiment of the present disclosure may be formed in various structures in addition to the above-described structure. For example, the pixel driver (PDC) may include five thin film transistors or more.

Figure 14:
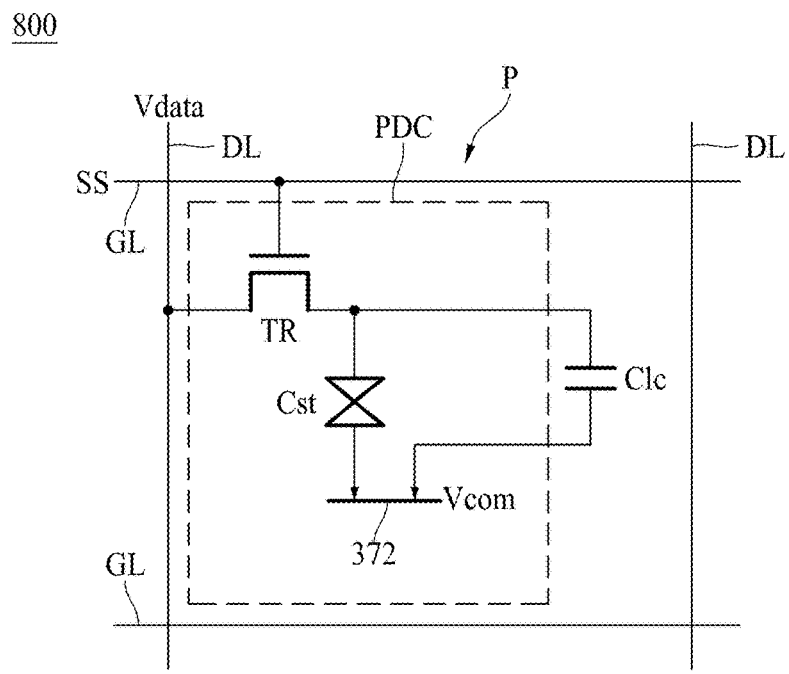
FIG. 14 is a circuit diagram for a pixel (P) of a display apparatus according to another embodiment of the present disclosure.

FIG. 14 is a circuit diagram for a pixel (P) of a display apparatus 800 according to another embodiment of the present disclosure.

The display apparatus 800 of FIG. 14 is a liquid crystal display apparatus.

The pixel (P) of the display apparatus 800 shown in FIG. 14 includes a pixel driver (PDC), and a liquid crystal capacitor (Clc) connected with the pixel driver (PDC). The liquid crystal capacitor (Clc) corresponds to a display device.

The pixel driver (PDC) includes a thin film transistor (TR) connected with a gate line (GL) and a data line (DL), and a storage capacitor (Cst) connected between the thin film transistor (TR) and a common electrode 372. Between the thin film transistor (TR) and the common electrode 372, the liquid crystal capacitor (Clc) and the storage capacitor (Cst) are connected in parallel.

The liquid crystal capacitor (Clc) charges a differential voltage between a common voltage (Vcom) supplied to the common electrode 372 and a data signal supplied to a pixel electrode through the thin film transistor (TR), and controls a light transmission amount by driving liquid crystal in accordance with the charged voltage. The storage capacitor (Cst) stably maintains the voltage charged in the liquid crystal capacitor (Clc).

The thin film transistor (TR) of FIG. 14 may have a structure which is identical to that of any one among the thin film transistors 100, 200, 300 and 400 shown in FIGS. 1, 2, 3 and 4.

FIGS. 15A to 15F illustrate a process of manufacturing the thin film transistor 100 according to one embodiment of the present disclosure.

Figure 15A:
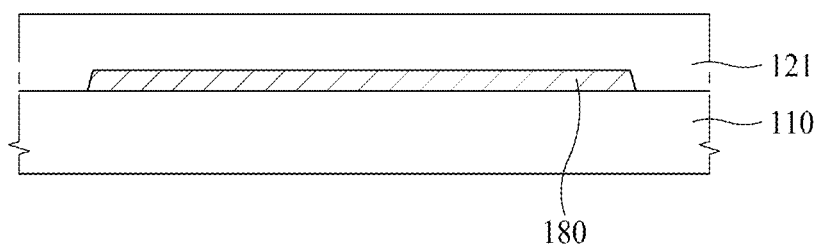
FIGS. 15A to 15F illustrate a process of manufacturing the thin film transistor according to one embodiment of the present disclosure.

Referring to FIG. 15A, the light shielding layer 180 is provided on the substrate 110, and the CVD layer 121 is provided on the light shielding layer 180. The CVD layer 121 may be manufactured by the CVD method.

The CVD layer 121 may include at least one of silicon oxide (SiOx) and silicon nitride (SiNx). The CVD layer 121 protects the active layer 130, and insulates the light shielding layer 180 and the active layer 130 from each other. However, one embodiment of the present disclosure is not limited to the above. The ALD layer may be formed instead of the CVD layer 121, or the ALD layer may be provided below the CVD layer 121.

Figure 15B:
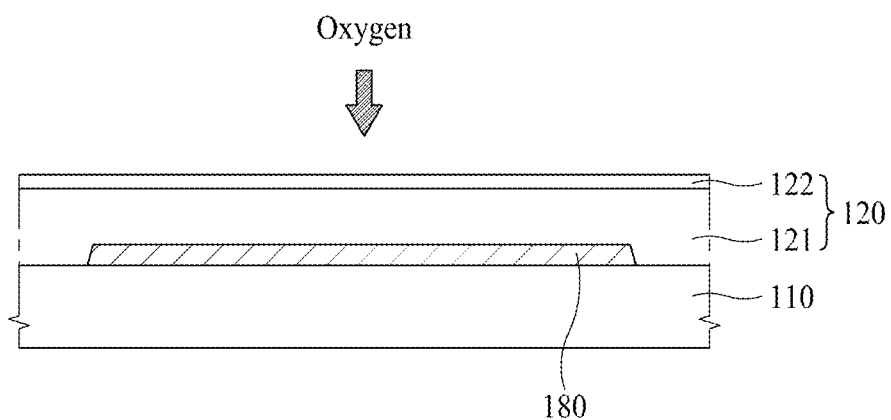

Referring to FIG. 15B, the Epi-oxide layer 122 is provided on the CVD layer 121. The Epi-oxide layer 122 may be manufactured by the ALD method or the MOCVD method.

The Epi-oxide layer 122 may include at least one among silicon oxide (SiOx), hafnium oxide (HfOx), aluminum oxide (AlOx), zirconium oxide (ZrOx), hafnium silicate (Hf-SiOx), and zirconium silicate (Zr-SiOx).

According to one embodiment of the present disclosure, the upper surface of the Epi-oxide layer 122 is the oxygen (O) layer made of oxygen (O). In order to make the upper surface of the Epi-oxide layer 122 be the oxygen (O) layer, the upper surface of the Epi-oxide layer 122 may be treated with oxygen. For example, when the Epi-oxide layer 122 is manufactured by the ALD method, the upper surface of the Epi-oxide layer 122 is treated with oxygen ($O_2$) gas for a final step, whereby the upper surface of the Epi-oxide layer 122 becomes the oxygen (O) layer. When the Epi-oxide layer 122 is manufactured by the MOCVD method, a surface of the Epi-oxide layer 122 is treated with oxygen ($O_2$) gas for a final step, whereby the upper surface of the Epi-oxide layer 122 becomes the oxygen (O) layer.

According as the CVD layer 121 and the Epi-oxide layer 122 are formed, the first insulating layer 120 is made.

The upper surface of the first insulating layer 120 comprising the CVD layer 121 and the Epi-oxide layer 122 is the oxygen (O) layer made of oxygen (O). According as the upper surface of the first insulating layer 120 is treated with oxygen, the upper surface of the first insulating layer 120 becomes the oxygen (O) layer.

Figure 15C:
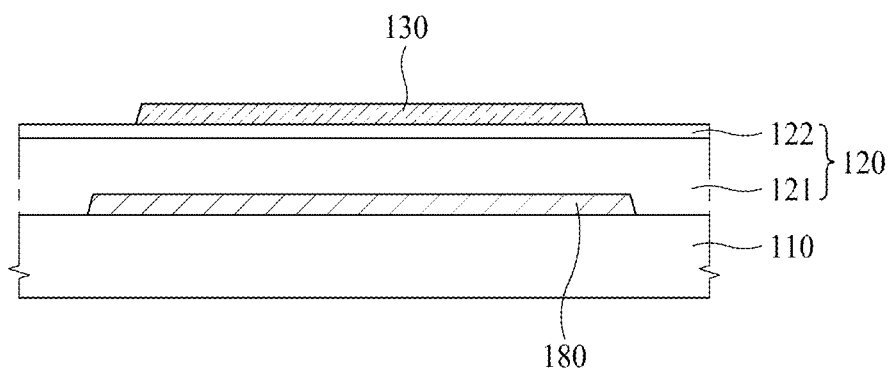

Referring to FIG. 15C, the active layer 130 is provided on the first insulating layer 120.

The active layer 130 is disposed on the Epi-oxide layer 122, and the active layer 130 contacts the Epi-oxide layer 122.

The active layer 130 is the oxide semiconductor layer made of the oxide semiconductor material. The active layer 130 made of the oxide semiconductor material includes the metal element, wherein the metal element (M) of the lower surface of the active layer 130 is combined with the oxygen (O) included in the oxygen layer on the upper surface of the first insulating layer 120. In more detail, the metal element (M) of the lower surface of the active layer 130 is combined with the oxygen (O) included in the oxygen layer on the upper surface of the Epi-oxide layer 122.

After the metal element (M) of the lower surface of the active layer 130 is combined with the oxygen (O) on the upper surface of the Epi-oxide layer 122, the crystal is continuously grown so that the oxide semiconductor materials are capable of being epitaxially grown. As a result, the active layer 130 may have the single crystal structure. The active layer 130 may be manufactured by the ALD method or the MOCVD method.

Figure 15D:
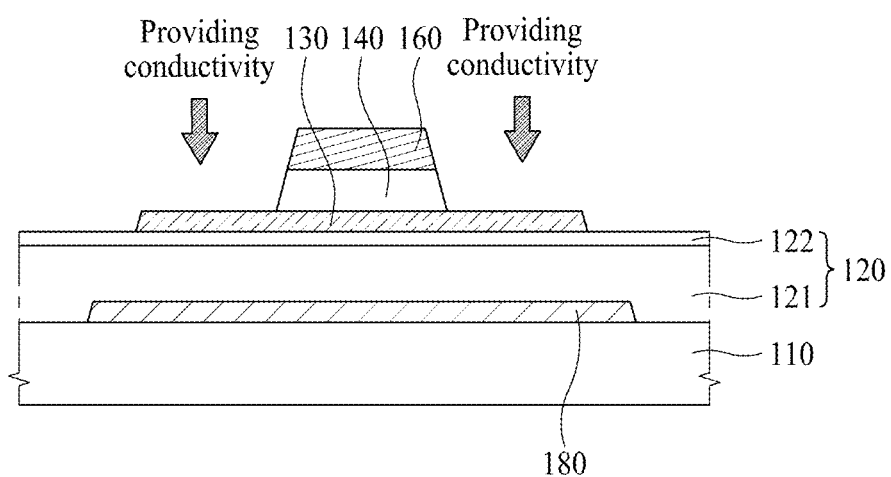

Referring to FIG. 15D, the second insulating layer 140 is provided on the active layer 130, and the gate electrode 160 is provided on the second insulating layer 140. The second insulating layer 140 is the gate insulating film in FIG. 15D.

At least a portion of the gate electrode 160 is overlapped with the active layer 130. The active layer 130 may be selectively provided with conductivity by a selective conductivity providing process using the gate electrode 160 as a mask.

In detail, some portions of the active layer 130, which are not overlapped with the gate electrode 160, may be selectively provided with conductivity.

Figure 15E:
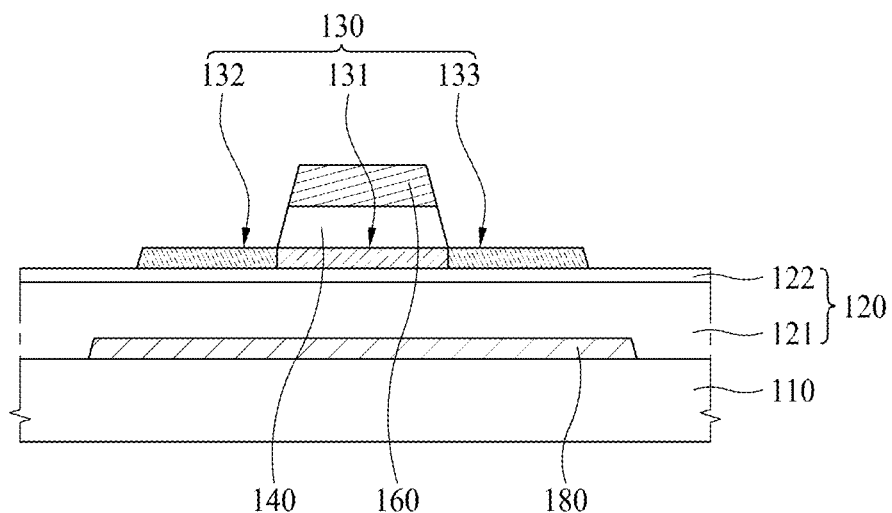

Referring to FIG. 15E, the conducting portions 132 and 133 are formed by the selective conductivity providing process for the active layer 130. In detail, a portion of the active layer 130, which is overlapped with the gate electrode 160, is not provided with conductivity, and thus becomes the channel portion 131. In addition, some portions of the active layer 130, which are not overlapped with the gate electrode 160, are provided with conductivity, and thus become the conducting portions 132 and 133. The conducting portions 132 and 133 are provided at both sides of the channel portion 131.

Any one of the conducting portions 132 and 133 becomes the source region, and the other becomes the drain region. The source region may function as the source connection portion connected with the source electrode 151, and the drain region may function as the drain connection portion connected with the drain electrode 152.

Figure 15F:
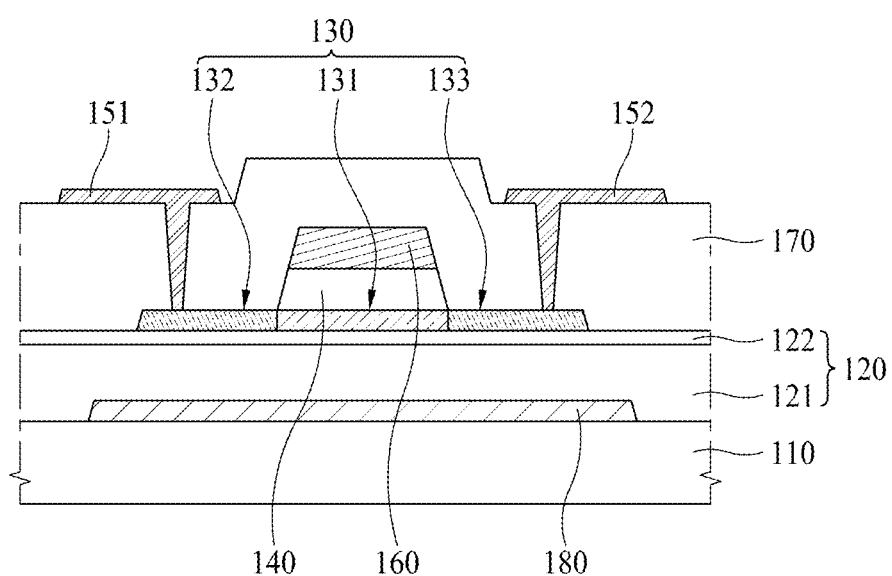

Referring to FIG. 15F, the insulating interlayer 170 is disposed on the gate electrode 160, and the source electrode 151 and the drain electrode 152 are disposed on the insulating interlayer 170.

The insulating interlayer 170 is the insulating layer made of the insulating material. The source electrode 151 and the drain electrode 152 are spaced apart from each other, and are connected with the active layer 130. The source electrode 151 and the drain electrode 152 are respectively connected with the active layer 130 through the contact hole provided in the insulating interlayer 170.

As a result, the thin film transistor 100 according to one embodiment of the present disclosure is made.

According to one embodiment of the present disclosure, it is possible to manufacture the oxide semiconductor layer having the single crystal structure by controlling the structure of the insulating layer.

The thin film transistor according to one embodiment of the present disclosure includes the active layer formed of the oxide semiconductor layer having the single crystal structure so that it is possible to realize a good field effect mobility.

The display apparatus comprising the thin film transistor according to one embodiment of the present disclosure may have a good display function.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is defined by the accompanying claims, and it is intended that all variations or modifications derived from the meaning, scope, and equivalent concept of the claims fall within the scope of the present disclosure.

What is claimed is:

1. A thin film transistor comprising:
a first insulating layer on a substrate, wherein the first insulating layer includes an epi-oxide layer, wherein an upper surface of the epi-oxide layer is an oxygen (O) layer made of oxygen (O), the oxygen layer being a physical layer;

an active layer on the first insulating layer, wherein a lower surface of the active layer is a metal layer made of a metal element (M); and a gate electrode spaced apart from the active layer and configured to have at least a portion overlapped with the active layer, wherein the active layer has a single crystal structure of an oxide semiconductor material, and wherein at an interface between the active layer and the epi-oxide layer, the oxygen layer of the epi-oxide layer is combined with the metal layer of the active layer.

2. The thin film transistor according to claim 1, wherein the Epi-oxide layer includes at least one among silicon oxide (SiOx), hafnium oxide (HfOx), aluminum oxide (AlOx), zirconium oxide (ZrOx), hafnium silicate (Hf-SiOx), and zirconium silicate (Zr-SiOx).

3. The thin film transistor according to claim 1, wherein the first insulating layer includes at least one of a chemical vapor deposition (CVD) layer and an atomic layer deposition (ALD) layer disposed between the substrate and the Epi-oxide layer.

4. The thin film transistor according to claim 3, wherein the chemical vapor deposition CVD layer include at least one of silicon oxide SiOx and silicon nitride SiNx.

5. The thin film transistor according to claim 1, wherein the first insulating layer further includes both of a chemical vapor deposition CVD layer and an atomic layer deposition ALD layer, and the atomic layer deposition ALD layer is disposed between the chemical vapor deposition CVD layer and the substrate.

6. The thin film transistor according to claim 1, wherein the Epi-oxide layer is manufactured by an atomic layer deposition ALD method or a metal organic chemical vapor deposition MOCVD method, in which the upper surface of the Epi-oxide layer is treated with oxygen for a final step.

7. The thin film transistor according to claim 1, wherein the active layer includes at least one among oxide semiconductor materials including ZO(ZnO)-based oxide semiconductor, IZO(InZnO)-based oxide semiconductor, IGZO(InGaZnO)-based oxide semiconductor, TO(SnO)-based oxide semiconductor, IGO(InGaO)-based oxide semiconductor, ITO(InSnO)-based oxide semiconductor, IGZTO(InGaZnSnO)-based oxide semiconductor, GZTO(GaZnSnO)-based oxide semiconductor, GZO(GaZnO)-based oxide semiconductor, GO(GaO)-based oxide semiconductor, IO(InO)-based oxide semiconductor, and ITZO(InSnZnO)-based oxide semiconductor.

8. The thin film transistor according to claim 1, wherein the active layer includes:

a first oxide semiconductor layer; and a second oxide semiconductor layer on the first oxide semiconductor layer.

9. The thin film transistor according to claim 1, further comprising a second insulating layer on the active layer.

10. The thin film transistor according to claim 9, wherein the second insulating layer is manufactured by an atomic layer deposition (ALD) method or a metal organic chemical vapor deposition (MOCVD) method.

11. The thin film transistor according to claim 1, wherein the first insulating layer is disposed between the substrate and the active layer.

12. The thin film transistor according to 11, wherein the active layer is disposed between the first insulating layer and the gate electrode.

13. The thin film transistor according to claim 11, wherein the gate electrode is disposed between the substrate and the first insulating layer.

14. A display apparatus comprising the thin film transistor of claim 1.

15. The display apparatus according to claim 14, wherein at least one of a switching transistor, a driving transistor, a reference transistor, and an emission control transistor in each pixel of the display apparatus is constituted by the thin film transistor according to claim 1.

16. A method for manufacturing a thin film transistor comprising:

providing a first insulating layer on a substrate, wherein forming the first insulating layer comprises forming an epi-oxide layer and treating the epi-oxide layer with oxygen such that an upper surface of the epi-oxide layer is an oxygen (O) layer made of oxygen (O), the oxygen layer being a physical layer;

providing an active layer on the first insulating layer, wherein a lower surface of the active layer is a metal layer made of a metal element (M); and providing a gate electrode spaced apart from the active layer and configured to have at least a portion overlapped with the active layer, the active layer is formed of an oxide semiconductor material, and wherein at an interface between the active layer and the epi-oxide layer, the oxygen layer of the epi-oxide layer is combined with the metal layer of the active layer.

17. The method according to claim 16, wherein the Epi-oxide layer is manufactured by an atomic layer deposition (ALD) method or a metal organic chemical vapor deposition (MOCVD) method.

18. The method according to claim 16, wherein the active layer is manufactured by an atomic layer deposition (ALD) method or a metal organic chemical vapor deposition (MOCVD) method.

19. The method according to claim 16, comprising at least one of providing a chemical vapor deposition (CVD) layer and providing an atomic layer deposition (ALD) layer by an ALD method before providing the Epi-oxide layer.

20. The method according to claim 19, wherein the step of providing an atomic layer deposition (ALD) layer is performed before the step of providing a chemical vapor deposition (CVD) layer.

* * * * *